(12) United States Patent
Kawaguchi et al.

(10) Patent No.: US 7,381,504 B2
(45) Date of Patent: Jun. 3, 2008

(54) METHOD AND APPARATUS FOR MANUFACTURING A COLOR CONVERSION FILTER

(75) Inventors: Koji Kawaguchi, Nagano (JP); Makoto Kobayashi, Nagano (JP); Kenya Sakurai, Nagano (JP)

(73) Assignee: Fuji Electric Holdings Co., Ltd., Tokyo (JP)

( * ) Notice: Subject to any disclaimer, the term of this patent is extended or adjusted under 35 U.S.C. 154(b) by 743 days.

(21) Appl. No.: 10/941,021

(22) Filed: Sep. 15, 2004

(65) Prior Publication Data

US 2005/0084775 A1    Apr. 21, 2005

(30) Foreign Application Priority Data

Oct. 7, 2003   (JP)  ............................ 2003-348881
Mar. 18, 2004  (JP)  ............................ 2004-078935

(51) Int. Cl.
G02F 1/23      (2006.01)
G09F 9/30      (2006.01)

(52) U.S. Cl. .................... 430/7; 430/330; 430/333; 430/334

(58) Field of Classification Search .................... None
See application file for complete search history.

(56) References Cited

U.S. PATENT DOCUMENTS

2002/0071071 A1*  6/2002  Sekiguchi et al.  ......... 349/106

2004/0046184 A1     3/2004  Yanagawa et al.
2004/0241560 A1    12/2004  Kawaguchi et al.
2005/0089772 A1*   4/2005  Kawaguchi et al.  .......... 430/7

FOREIGN PATENT DOCUMENTS

| JP | 11-279426      |   | 10/1999 |
|----|----------------|---|---------|
| JP | 2000-012217 A  | * | 1/2000  |
| JP | 2000-044824    |   | 2/2000  |
| JP | 2001-164245    |   | 6/2001  |
| JP | 2002-231450    |   | 8/2002  |
| JP | 2004319471     |   | 11/2004 |

* cited by examiner

*Primary Examiner*—John A. McPherson
(74) *Attorney, Agent, or Firm*—Rabin & Berdo, P.C.

(57) ABSTRACT

A method and apparatus for manufacturing a color conversion filter. The method includes forming a color filter layer on a transparent substrate. A coloring matter layer containing color conversion coloring matter and an optical radical generating agent are formed on the substrate and the filter layer. The coloring matter layer is exposed to coloring matter decomposition light applied through the substrate and the filter layer. The coloring matter layer also is exposed to auxiliary ultraviolet light applied from the side of the coloring matter layer. This forms a color conversion layer at a position corresponding to the filter layer. The optical radical generating agent is heat vaporized. The color conversion coloring matter is decomposed by light whose wavelength is outside a range that the color filter layer transmits. The coloring matter decomposition light includes a wavelength component that decomposes the color conversion coloring matter. The color conversion layer emits, through wavelength profile conversion, light that the color filter layer transmits.

31 Claims, 7 Drawing Sheets

METHOD AND APPARATUS FOR MANUFACTURING A COLOR CONVERSION FILTER

BACKGROUND OF THE INVENTION

1. Field of the Invention

The invention relates to a method of manufacturing, and apparatus for use in manufacturing a color conversion filter that enables multicolor display. The color conversion filter can be used, for example, for the display provided by image sensors, personal computers, word processors, TV receivers, facsimile machines, audio apparatus, video apparatus, car navigation apparatus, desktop calculators, telephones, portable terminals, industrial measuring instruments, and related devices.

2. Background Art

In recent years, as one method for realizing multicolor or full-color display devices, a color conversion method has been studied that employs, as filters, color conversion coloring matter (or material) that absorbs near ultraviolet light, blue light, bluish green light, or white light and emits light in visible ranges through wavelength profile conversion. See, for example, Japanese Patent Publications JP-A-8-279394 and JP-A-8-2860331. Employment of the color conversion method makes it possible to increase the degree of freedom in light source selection, because the light source emission color is not limited to white. For example, green light and red light can be obtained through wavelength profile conversion by using a blue organic EL light-emitting device. Therefore, more efficient light sources can be used. A feasibility study has been made of a full-color emission-type display device using a weak energy beam such as near ultraviolet light or visible light, as is described in Japanese Patent Publication JP-A-9-804343).

In addition to realization of a high-resolution color display function and long-term stability of characteristics including the color reproducibility, provision of color conversion filters having high color conversion efficiency is an important issue for the practical use of color display devices. However, if the density of a color conversion coloring material is made higher in order to increase the color conversion efficiency, problems occur such as reduced efficiency due to what is called density extinction and decomposition with age of the color conversion coloring matter. Therefore, the current situation is such that desired color conversion efficiency is obtained by increasing the thickness of a color conversion layer including color conversion coloring matter. To prevent the density extinction and the decomposition of color conversion coloring matter, introducing a bulky substituent into a coloring matter nucleus has been studied (see Japanese Patent Publications JP-A-11-279426, JP-A-2000-44824 and JP-A-2001-164245). To prevent the decomposition of color conversion coloring matter, mixing of a quencher also has been studied (see Japanese Patent Publication JP-A-2002-231450).

To increase the resolution of a multicolor or full-color display device that employs the color conversion method, it is necessary to pattern the color conversion layers at a high resolution. However, if patterning should be performed in such a manner that the width of each pattern is smaller than the film thickness, issues such as pattern shape reproducibility and pattern deformation arise in subsequent manufacturing steps. In addition, where patterning is performed by ordinary photolithography, a coating step, an exposure step including mask registration, and a development step are needed to obtain a color conversion layer of each color. For example, to manufacture a full-color display device which has at least red, green, and blue color conversion layers, a complicated manufacturing process consisting of a large number of steps is required.

OBJECT AND SUMMARY OF THE INVENTION

An object of the invention therefore is to provide a method of manufacturing a color conversion filter that can simplify a manufacturing process and enables high-resolution patterning, as well as to provide an apparatus to be used to perform such a method.

A method of manufacturing a color conversion filter according to a first embodiment of the invention includes forming a color filter layer on a transparent substrate. A layer of coloring matter (material) containing color conversion coloring matter and an optical radical generating agent are formed on the transparent substrate and the color filter layer. The layer of coloring matter is exposed to coloring matter decomposition light that is applied through the transparent substrate and the color filter layer, and is also exposed to auxiliary ultraviolet light that is applied from the side of the coloring matter layer. Thereby, a color conversion layer is formed at a position corresponding to the color filter layer. The optical radical generating agent is then vaporized by heat. The manufacturing method further includes decomposing the color conversion coloring matter by light in a wavelength range outside a wavelength range of light that the color filter layer transmits. The coloring matter decomposition light includes a wavelength component that decomposes the color conversion coloring matter.

The color conversion layer emits, through wavelength profile conversion, light that the color filter layer transmits. The coloring matter decomposition light may include a wavelength component of 450 to 650 nm. The auxiliary ultraviolet light may include a G, I, or H-line wavelength component. It is preferable that the optical radical generating agent be selected from radical polymerization initiators whose boiling temperature or sublimation temperature is lower than or equal to 200° C. The color conversion layer-forming step may be executed in an inert atmosphere or in a state in which the temperature of the substrate is higher than or equal to 50° C.

A method of manufacturing a color conversion filter according to a second embodiment of the invention includes forming n kinds of color filter layers on a transparent substrate, n being an integer in the range of 2 to 6, inclusive. A coloring matter layer containing n−1 kinds of color conversion coloring matter and an optical radical generating agent are formed on the transparent substrate and the n kinds of color filter layers. The coloring matter layer is exposed to coloring matter decomposition light that is applied through the transparent substrate and the n kinds of color filter layers. The coloring matter layer also is exposed to auxiliary ultraviolet light that is applied from the side of the coloring matter layer. Thereby, an mth kind of color conversion layer is formed at a position corresponding to an mth kind of color filter layer, for each m, m equals 1 to n−1. The optical radical generating agent is vaporized by heating it. The manufacturing method further includes transmitting from the n kinds of color filter layers light in different wavelength ranges. An mth kind of color conversion coloring matter is decomposed by light that the mth kind of color filter layer does not transmit. The mth kindofcolorconversionlayeremits, throughwavelengthprofile conversion, light that the mth kind of color filter layer transmits.

The manufacturing method also includes transmission by an (m+1)th kind of color filter layer light in a range of wavelengths that are shorter than the wavelengths that the mth kind of color filter layer transmits. The mth kind of color conversion coloring matter is decomposed by light in a range of wavelengths that are shorter than the wavelengths of light that the mth kind of color filter layer transmits. The coloring matter decomposition light may include all wavelength components capable of decomposing the n−1 kinds of color conversion coloring matter. It is preferable that the coloring matter decomposition light include a wavelength component of 450 to 650 nm.

Further, the manufacturing method may be such that the exposure is performed plural separate times, and that a wavelength component for decomposing the mth kind of color conversion coloring matter is included in one of coloring matter decomposition light beams that are used for the plural times of exposure. It is more desirable that the exposure be performed n−1 times, and that mth-time exposure is performed by using light including a wavelength component capable of decomposing the mth kind of color conversion coloring matter. It is also desirable that the auxiliary ultraviolet light include a wavelength component selected from among the G-line, the I-line, and the H-line.

It is preferable that the optical radical generating agent be selected from radical polymerization initiators whose boiling temperature or sublimation temperature is lower than or equal to 200° C. The color conversion layer forming step may be executed in an inert atmosphere or in a state that a substrate temperature is higher than or equal to 50° C.

The manufacturing method according to the second embodiment may be such that the coloring matter layer further contains an nth color conversion coloring material. According to the second embodiment, an nth color conversion layer is formed by exposure at a position corresponding to the nth color filter layer, and the nth color conversion coloring matter emits, through wavelength profile conversion, light that the nth color filter layer transmits. An (m+1)th kind of color filter layer may transmit light having a wavelength in a range of wavelengths that are shorter than that in which the mth kind of color filter layer transmits. The mth kind of color conversion coloring matter may be decomposed by light in a wavelength range in which the wavelength is shorter than that in a wavelength range of light that the mth kind of color filter layer transmits. It is desirable that the coloring matter decomposition light include all wavelength components capable of decomposing the n−1 kinds of color conversion coloring matter. It is even more desirable that the coloring matter decomposition light includes a wavelength component of 450 to 650 nm. The auxiliary ultraviolet light may include a wavelength component selected from among the G-line, the I-line, and the H-line. Further, the manufacturing method may be such that the exposure is performed at plural separate times. The method also may be such that a wavelength component for decomposing a kth kind of color conversion coloring matter is included in one of coloring matter decomposition light beams that are used for the plural exposure times o, for each k, k equals 1 to n−1. It is still more desirable that the exposure be performed divisionally in n−1 times, and that kth-time exposure be performed by using light including a wavelength component capable of decomposing the kth kind of color conversion coloring matter. It is preferable that the optical radical generating agent be selected from radical polymerization initiators whose boiling temperature or sublimation temperature is lower than or equal to 200° C. The color conversion layer forming step may be executed in an inert atmosphere or in a state that a substrate temperature is higher than or equal to 50° C.

A color conversion layer forming apparatus according to a third embodiment of the invention is a color conversion layer forming apparatus which is used in the method of manufacturing a color conversion filter according to the first or second embodiment. The apparatus includes a coloring matter decomposition light illuminating means disposed so as to be opposed to the transparent substrate, for applying coloring matter decomposition light to the transparent substrate perpendicularly. The apparatus also includes an auxiliary ultraviolet light illuminating means disposed so as to be opposed to the coloring matter layer, for applying auxiliary ultraviolet light to the coloring matter layer. It is desirable that the coloring matter decomposition light illuminating means apply light including a wavelength component of 450 to 650 nm. It is desirable that that the auxiliary ultraviolet light illuminating means apply light including a wavelength component from among the G-line, the I-line, and the H-line. The color conversion layer forming apparatus according to this embodiment may further comprise substrate heating means for heating the transparent substrate and/or a means for replacing atmospheric air inside of the apparatus by an inert atmosphere, that is for filling the inside of the apparatus with an inert atmosphere.

A color conversion filter manufacturing apparatus according to a fourth embodiment of the invention is a color conversion filter manufacturing apparatus that is used in the method of manufacturing a color conversion filter according to the first or second embodiment. This apparatus includes a coloring matter layer forming apparatus for forming a coloring matter layer on one or more color filter layers and a transparent substrate on which the color filter layer(s) are formed. The apparatus of this embodiment also includes a preliminary drying apparatus for drying the coloring matter layer preliminarily, the color conversion layer forming apparatus according to the third embodiment, and a heating and removing apparatus for removing the optical radical generating agent by heating it.

The above-constituted manufacturing methods according to the invention make it possible to form high-resolution color conversion layers by self-alignment using the color filter layers as a mask. Since radicals are generated by causing the optical radical generating agent contained in the coloring matter layer to react with auxiliary ultraviolet light, color conversion layers can be formed at high speed. Further, the invention eliminates the need for forming patterns of color conversion layers by photolithography, which makes it possible to shorten the process. Further, since thicker color conversion layers can be formed so as to be integral with a planarized layer, deformation or the like of the color conversion layers can be suppressed even if their width is small relative to the film thickness. Therefore, the methods of the invention make it possible to manufacture color conversion filters that are used for micro-display devices (e.g., viewfinders of video cameras). Still further, since alignment need not be performed in the exposure for formation of color conversion layers, the color conversion layer forming apparatus and the color conversion filter manufacturing apparatus according to the invention have simple mechanisms.

BRIEF DESCRIPTION OF THE DRAWINGS

FIGS. 7A and 7B show manufacturing apparatus of a color conversion filter according to a fourth embodiment, in which FIG. 7A is a schematic view of a serial apparatus and FIG. 7B is a schematic view of a star-type apparatus.

DETAILED DESCRIPTION OF THE PREFERRED EMBODIMENTS

Figure 1A:
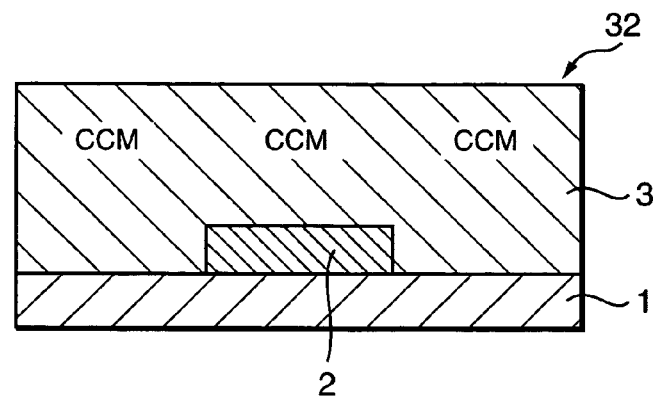
FIGS. 1A to 1C are schematic views illustrating a method of manufacturing a color conversion filter according to a first embodiment.
Figure 1B:
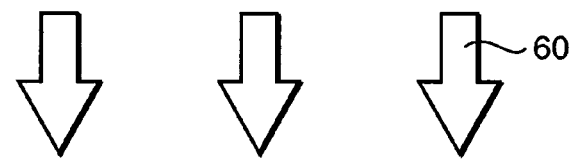
Figure 1B:
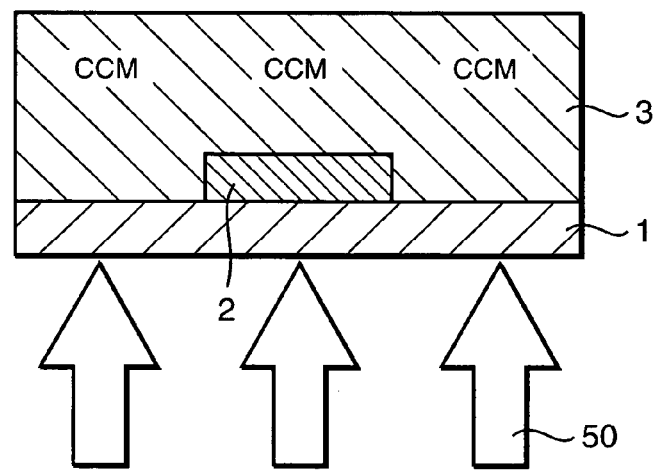
Figure 1C:
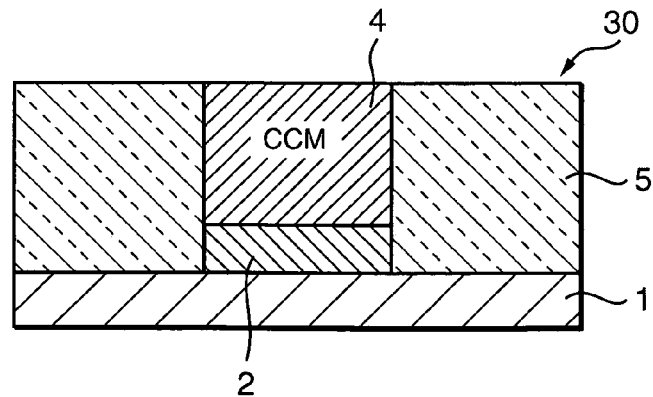

FIGS. 1A to 1C illustrates a method of manufacturing a color conversion filter according to a first embodiment of the invention. FIG. 1A shows a coloring matter layer laminated body (hereinafter simply "laminated body") 32 in which a color filter layer 2 and a coloring matter layer 3 containing color conversion coloring matter (material)(CCM) and an optical radical generating agent are formed on a transparent substrate 1.

The transparent substrate 1 needs to be transparent to visible light (wavelength: 400 to 700 nm), preferably light that has been produced by a color conversion layer 4 through conversion. The transparent substrate 1 should be resistant to conditions (a solvent, a temperature, etc.) of formation of the color conversion layer 4 and other layers that are formed when necessary (described later), and it is preferable that the transparent substrate 1 be superior in the stability of dimensions. Preferable examples of the material of the transparent substrate 1 are glass and such resins as polyethylene terephthalate and poly(methyl methacrylate). Borosilicate glass, blue plate glass, and the like are even more preferred.

The color filter layer 2 is a layer for transmitting light only in a desirable wavelength range. In a completed color conversion filter, the color filter layer 2 interrupts light that originates from a light source and has not been wavelength-profile-converted by the color conversion layer 4, and is effective in improving the color purity of light that has been produced by the color conversion layer 4 through wavelength profile conversion. In addition, the color filter layer 2 of this embodiment functions as a mask in forming the color conversion layer 4, by patterning the coloring matter layer 3 in step (b) (described later). The color filter layer 2 contains coloring matter and a photosensitive resin. It is preferable that the coloring matter be a pigment that is highly resistant to light. Examples of the photosensitive resin are (1) a composition consisting of an acrylic multifunctional monomer and oligomer having a plurality of acryloyl groups and/or methacryloyl groups and a photopolymerization initiator, (2) a composition consisting of poly(vinylcinnamic ester) and a sensitizer, and (3) a composition consisting of chain or cyclic olefin and bisazide (nitrene is generated to polymerize olefin). For example, the color filter layer 2 may be made of a liquid crystal color filter material on the market (e.g., Color Mosaic of Fujifilm Arch Co., Ltd.).

The thickness of the color filter layer 2 is 1 to 2.5 μm, preferably 1 to 1.5 μm, though it depends on the content of the coloring matter. Being in such a thickness range, the color filter layer 2 can be patterned at a high resolution and is given such a transmission spectrum as to be able to function well as a mask used in step (b) (described later) and a filter of a completed color conversion filter.

The coloring matter layer 3 is a layer containing color conversion coloring matter, an optical radical generating agent, and a matrix resin. The color conversion coloring matter is a coloring material that performs wavelength profile conversion on incident light and thereby emits light that is in such a wavelength range as to be transmitted by the color filter layer 2. It is preferable that the color conversion coloring matter be a coloring material that performs wavelength profile conversion on near ultraviolet light or blue to bluish green light, and thereby emits light (e.g., blue, green, or red light) that is in such a wavelength range as to be transmitted by the color filter layer 2. If necessary, the color conversion coloring matter may perform wavelength profile conversion within the transmission wavelength range of the color filter layer 2. The color conversion coloring matter is selected from coloring matter that is decomposed by light that has passed through the transparent substrate 1 but is not decomposed by light that has passed through the color filter layer 2. It is important that the color conversion coloring matter not produce colored decomposition products when decomposed by light that has passed through the transparent substrate 1. In particular, it is strongly required that the color conversion coloring matter, does not absorb light in a wavelength range obtained by the wavelength profile conversion. This is because absorption of light in the above wavelength range causes a reduction in optical conversion efficiency. Colored decomposition products are not preferred because they cause undesired coloration in a resulting color conversion filter, even if they do not absorb light in the above wavelength range.

Examples of color conversion coloring matter that emits red light by absorbing light in a blue to bluish green range are rhodamine-type coloring materials such as rhodamine B, rhodamine 6G, rhodamine 3B, rhodamine 101, rhodamine 110, sulforhodamine, Basic Violet 11, and Basic Red 2, cyanine-type coloring matter, pyridine-type coloring matter such as 1-ethyl-2-[4-(p-dimethylaminophenyl)-1,3-butadienyl]-pyridinium perchlorate (pyridine 1), and oxazine-type coloring material.

Exemplary color conversion coloring materials that emit green light by absorbing light in a blue to bluish green range include coumarin-type coloring matter such as 3-(2'-benzothiazolyl)-7-diethylamino-coumarin (coumarin 6), 3-(2'-benzoimidazolyl)-7-diethylamino-coumarin (coumarin 7), 3-(2'-N-methylbenzoimidazolyl)-7-diethylamino-coumarin (coumarin 30), and 2,3,5,6-1H,4H-tetrahydro-8-trifluoromethylquinolizine (9,9a, 1-gh), coumarin (coumarin 153), Basic Yellow 51 that is a coumarin coloring matter type dye, and naphthalimide-type coloring matter such as Solvent Yellow 11 and Solvent Yellow 116.

Exemplary fluorescent coloring matter that emits blue light by absorbing light in a near ultraviolet or visible range includes coumarin-type coloring matter such as coumarin 466, coumarin 47, coumarin 2, and coumarin 102.

The color conversion coloring matter is not limited to the above examples. Various dyes (direct dyes, acid dyes, alkaline dyes, disperse dyes, etc.) can be used as long as (1) they are capable of desired wavelength profile conversion, (2) they are decomposed by light that has passed through the transparent substrate 1 but are not decomposed by light that has passed through the color filter layer 2, and (3) they do not produce colored decomposition products when decomposed optically.

Various thermoplastic resins can be used as the matrix resin. Since the optical radical generating agent is removed by heating as described later, the matrix resin is required to be resistant to the heating step: it is desirable that the matrix resin is not decomposed or deformed by heating at 100° C. ordinarily, preferably at 150° C. Usable examples of the matrix resin include acrylic resins such as (methacrylate ester), alkyd resins, aromatic hydrocarbon resins such as polystyrene, cellulose resins, polyester resins such as poly (ethylene terephthalate), polyamide resins such as nylons, polyurethane resins, poly(vinyl acetate) resins, poly(vinyl alcohol) resins, and mixtures of those resins.

In the invention, it is desirable that the color conversion coloring matter of 0.2 μmol or more, preferably 1 to 20 μmol, even more preferably 3 to 15 μmol, be used per 1 g of matrix resin used. The thickness of the color conversion layer 4 (and hence the coloring matter layer 3 and a planarized layer 5) is 5 μm or more, preferably 7 to 15 μm. The color conversion layer 4 having such a thickness makes it possible to obtain color-converted output light having a desired intensity. If necessary, the color conversion layer 4 may contain plural kinds of coloring matter.

The optical radical generating agent is added to the coloring matter layer 3 to generate radicals when irradiated with auxiliary ultraviolet light 60 and to thereby accelerate decomposition of the color conversion coloring matter. After completion of an exposure step (described later), the optical radical generating agent is vaporized by heating and thereby removed from the coloring matter layer 3, that is, from the color conversion layer 4 and the planarized layer 5 that has been formed. Therefore, the optical radical generating agent is required to vaporize at a temperature at which the color conversion coloring matter is not decomposed: it is desirable that the boiling temperature (or sublimation temperature) of the optical radical generating agent be 200° C. or less ordinarily, preferably 180° C. or less, even more preferably 150° C. or less. It is preferable that the optical radical generating agent does not generate radicals when heated for vaporization. Examples of the optical radical generating agent, usable in the invention, are biacetyl and the like, acetophenone and the like, and di-tert-butyl peroxide. It is preferable that the optical radical generating agent be used at a proportion of 2 to 4% by mass with respect to the matrix resin used.

In an exposure step (color conversion layer forming step) illustrated in FIG. 1B, coloring matter decomposition light 50 is applied from the side of the transparent substrate 1 so that the light 50 reaches the coloring matter layer 3 through the color filter layer 2. At the same time, auxiliary ultraviolet light 60 is applied from the side of the coloring matter layer 3. The coloring matter decomposition light 50 should be applied perpendicularly to the substrate 1 (and hence the color filter layer 2 and the coloring matter layer 3). If the coloring matter decomposition light 50 were applied obliquely, not only the portions of the coloring matter layer 3 that are not covered with the color filter layer 2, but also the adjacent portions of the coloring matter layer 3 right over the color filter layer 2, would be exposed to the coloring matter decomposition light 50. The perpendicular application of the coloring matter decomposition light 50 is particularly important in the case of forming high-resolution patterns.

The coloring matter decomposition light 50 includes a wavelength component that decomposes the color conversion coloring matter contained in the coloring matter layer 3, but that is absorbed by the color filter layer 2. To form a color conversion layer for red or green, the coloring matter decomposition light 50 may be light including a wavelength component of 450 to 650 nm (or white light). For formation of a color conversion layer 4 for red, for example, the color filter layer 2 is red, and among the wavelength components a component of 600 nm and shorter that does not pass through the red color filter layer 2 functions as effective coloring matter decomposition light. Similarly, for formation of a color conversion layer 4 for green, the color filter layer 2 is green, and among the wavelength components a component of 500 nm and shorter that does not pass through the green color filter layer 2 functions as effective coloring matter decomposition light. In the case of forming a color conversion layer 4 for green, although a component longer than 600 nm does not pass through the green color filter layer 2 either, this component is not absorbed by the color conversion coloring matter and hence does not function as part of the effective coloring matter decomposition light.

The intensity of the coloring matter decomposition light 50 that is used for the exposure should be much higher than that of light on which wavelength profile conversion is supposed to be performed by a color conversion filter to be formed. It is desirable that the intensity of the coloring matter decomposition light 50 be 0.05 W/cm$^2$ or more, preferably 1 W/cm$^2$ or more, at the surface of the transparent substrate 1 on which the light 50 is incident, though it depends on the color conversion coloring matter, etc., that is used. The exposure time, which depends on the desired degree of decomposition of the color conversion coloring matter, is an item that can be determined as appropriate by a person skilled in the art. The use of high-intensity light makes it possible to decompose the color conversion coloring matter in desired regions.

Arbitrary light sources known in the art such as a halogen lamp, a metal halide lamp, an incandescent lamp, a discharge lamp, a mercury vapor lamp, and a laser may be used as the light source of the coloring matter decomposition light 50. However, they should satisfy the above-mentioned conditions relating to the wavelength.

It is preferable that the auxiliary ultraviolet light 60, which is used for causing the optical radical generating agent to generate radicals, be ultraviolet light in a wavelength range of 250 to 400 nm. It is even more preferable that the auxiliary ultraviolet light 60 has the wavelength component of the G-line, the I-line, or the H-line of the high-pressure mercury vapor lamp. Reference in the present specification and appended claims to the G-line, the I-line, or the H-line is intended to designate a range of wavelengths centered where the G-line, the I-line, and the H-line are centered in the spectrum of light output by the mercury vapor lamp. Such reference is not intended to reflect the particular, exact range and distributions of light waves output by the mercury vapor lamp. It is desirable that the intensity of the auxiliary ultraviolet light 60 be 1 to $\frac{1}{100}$ of that of auxiliary ultraviolet light for ordinary photolithography. It is desirable that the intensity of the auxiliary ultraviolet light 60 be 1 to 100 mW/cm$^2$, preferably 10 to 50 mW/cm$^2$, on the surface of the coloring matter layer 3 on which the light 60 is incident, though it depends on the type and the amount of the optical radical generating agent that the color matter layer contains. A mercury vapor lamp, a discharge lamp, or the like that is equipped with a proper ND filter can be used as a light source. The auxiliary ultraviolet light 60 need not necessarily be applied perpendicularly to the coloring matter layer 3. However, to obtain a uniform illumination intensity distribution, it is preferable that the auxiliary ultraviolet light 60 be applied perpendicularly to the coloring matter layer 3.

When the coloring matter layer 3 is exposed to the coloring matter decomposition light 50 and the auxiliary ultraviolet light 60, the color conversion coloring matter is decomposed in the regions that are not covered with the color filter layer 2, while it is not decomposed in the regions that are covered with the color filter layer 2. In this step, the color conversion coloring matter that is rendered in an excited state by absorbing the coloring matter decomposition light 50 is decomposed quickly, being assisted by radicals that are generated by the optical radical generating agent that receives the auxiliary ultraviolet light 60. As a result, as shown in FIG. 1C, a color conversion layer 4 is formed on the color filter layer 2 and a colorless planarized layer 5 not containing the color conversion coloring matter is formed in the regions that are not covered with the color filter layer 2, whereby a color conversion filter 30 is obtained (the optical radical generating agent has not been removed yet). The decomposition of the color conversion coloring matter is very much accelerated by radicals that are generated by the optical radical generating agent that receives the auxiliary ultraviolet light 60. In this embodiment, the color conversion layer 4 has the same composition as the original coloring matter layer 3.

Figure 6:
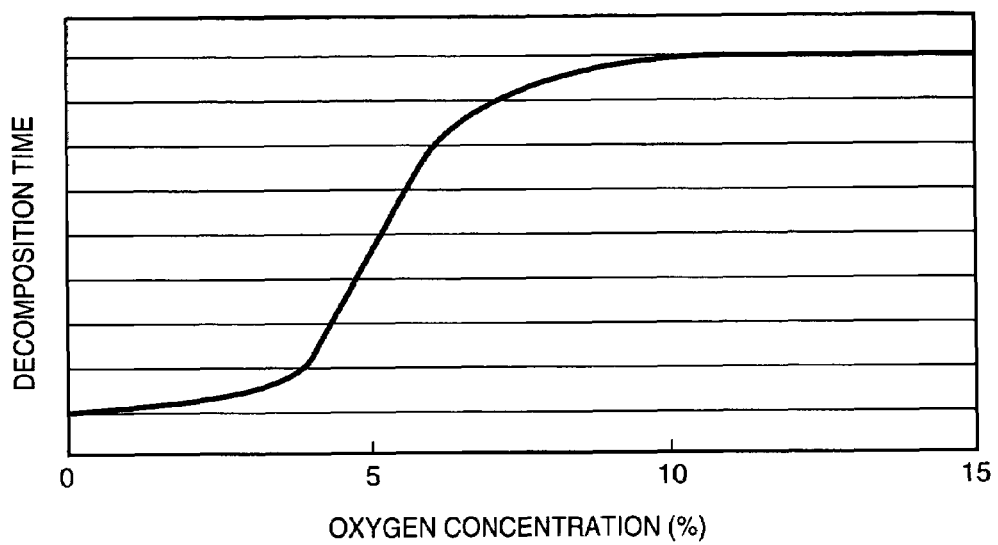
FIG. 6 is a graph showing a relationship between the oxygen concentration and the decomposition time in forming a coloring matter layer.

In the exposure step (color conversion layer forming step) of the method of the invention, the color conversion coloring matter is decomposed in desired regions within a short time by utilizing a mechanism that the color conversion coloring matter that is excited by the coloring matter decomposition light 50 is decomposed through reaction with radicals that are generated by the optical radical generating agent that receives the auxiliary ultraviolet light 60. As a matter of fact, it has been found that the presence of oxygen, which can function as a radical polymerization inhibitor, adversely affects the method of the invention. More specifically, radicals generated by the optical radical generating agent are consumed by oxygen before reacting with the color conversion coloring matter, whereby the decomposition rate of the color conversion coloring matter is lowered. FIG. 6 shows a relationship in the exposure step between the oxygen concentration around the substrate and the decomposition time of the color conversion coloring matter in the coloring matter layer 3. As seen in FIG. 6, the decomposition reaction of the color conversion coloring matter proceeds efficiently in an atmosphere whose oxygen concentration is lower than 5%. In view of this, it is preferable that the exposure step of the method of the invention be executed under an air shutoff condition or in an inert atmosphere using a rare gas (He, Ne, Ar, Xe, or the like), a nitrogen gas, or the like.

One means for accelerating the decomposition reaction of the color conversion coloring matter would be to increase the temperature of the coloring matter layer during the exposure. However, if the temperature is too high, thermal decomposition of the color conversion coloring matter may occur in the entire coloring matter layer 3, which would prevent formation of a color conversion layer 4. Further, if the optical radical generating agent is vaporized due to too high a temperature, the rate of decomposition of the color conversion coloring matter may decrease. The proper heating temperature may vary depending on the types of color conversion coloring matter and optical radical generating agent used. For example, where a rhodamine-type coloring material and a coumarin-type coloring material were used, their decomposition rates were different at temperatures higher than or equal to 60° C. and thermal decomposition of those coloring materials started at 160° C. In general, the exposure step of the invention can be executed at room temperature. However, it is preferable that the exposure step be performed in a temperature range of 60 to 100° C., and it i seven more preferable that the exposure step be performed in a temperature range of 70 to 90° C. The substrate can be heated by convection or forced circulation of a heated atmosphere or by using a radiation heat source such as an infrared lamp.

Finally, the optical radical generating agent remaining in the color conversion layer 4 and the planarized layer 5 is removed by heating, whereby a color conversion filter 30 is obtained. The heating conditions (temperature and time) depend on the types of color conversion coloring matter, matrix resin, and optical radical generating agent used. Such conditions should be determined with the following factors taken into consideration: Consideration should be given to the degree of thermal decomposition of the color conversion coloring matter in this step, and to the degree of its decomposition that will occur during the operation due to a residual optical radical generating agent. In general, conditions of 120° C. and 5 minutes, preferably 180° C. and 3 minutes, are useful in which priority is given to avoiding residual optical radical generating agent. In this heating step, pressure reduction can accelerate the removal of the optical radical generating agent or can make the heating step a lower temperature process. The pressure reduction is also effective in preventing the thermal decomposition of the color conversion coloring matter. The pressure may be in a range of 1 mmHg (0.13 kPa) to atmospheric pressure, preferably 5 mmHg (0.67 kPa) to 100 mmHg (13.3 kPa), even more preferably 10 mmHg (1.33 kPa) to 50 mmHg (6.67 kPa) Where the pressure is set at 10 mmHg (1.33 kPa), for example, the removal of the optical radical generating agent can be completed by heating at 120° C. for 2 minutes, preferably 180° C. for 1 minute.

Figure 2A:
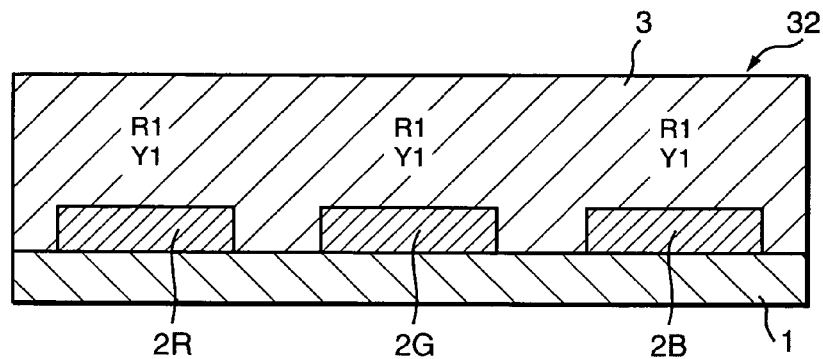
FIGS. 2A to 2C are schematic views illustrating a method of manufacturing a color conversion filter according to a second embodiment.
Figure 2B:
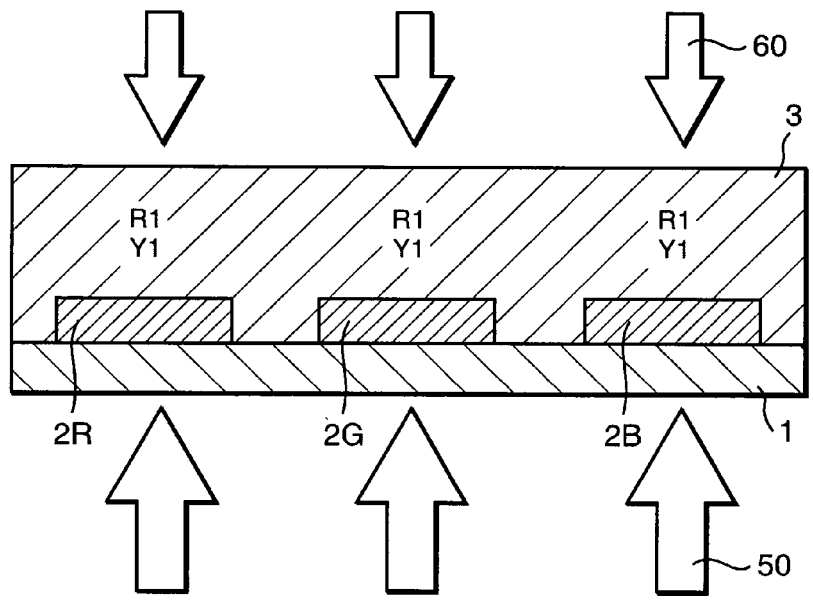
Figure 2C:
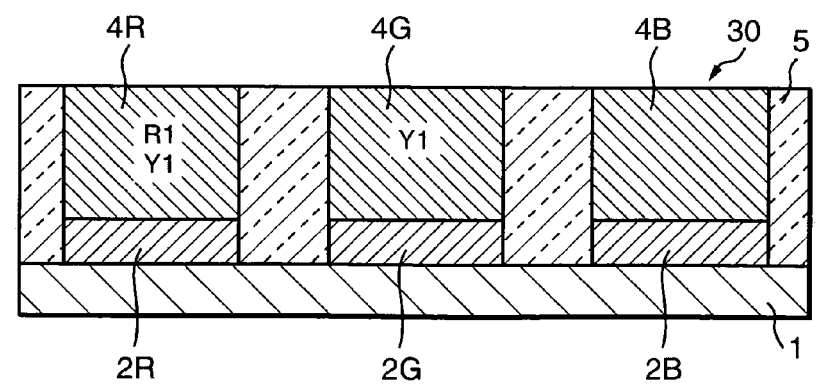

A method of manufacturing a color conversion filter according to a second embodiment of the invention includes forming n kinds of color filter layers on a transparent substrate, n being an integer of 2 to 6. A coloring matter layer containing n−1 kinds of color conversion coloring matter is formed on the n kinds of color filter layers. The coloring matter layer is exposed to coloring matter decomposition light 50 and auxiliary ultraviolet light 60 through the transparent substrate and the color filter layers, and thereby forms an mth kind of color conversion layer at a position corresponding to an mth kind of color filter layer, m being each of the integers 1 to n−1. Also, the n kinds of color filter layers transmit light in different wavelength ranges. The mth kind of color conversion coloring matter is decomposed by light that the mth kind of color filter layer does not transmit. Further, the mth kind of color conversion coloring matter emits, through wavelength profile conversion, light that the mth kind of color filter layer transmits. FIGS. 2A to 2C show a case where n=3.

FIG. 2A shows a laminated body 32 in which a first (red) color filter layer 2R, a second (green) color filter layer 2G, and a third (blue) color filter layer 2B, and a coloring matter layer 3 containing a first (red) color conversion coloring material R1 and a second (green) color conversion coloring material Y1 are formed on a transparent substrate 1. The first color conversion coloring matter R1 is a coloring material that emits red light through wavelength profile conversion, preferably a coloring material that emits red light (wavelength range: 600 to 700 nm) by performing wavelength profile conversion on near ultraviolet light or blue to bluish green light. The first color conversion coloring material R1 is decomposed by light including a wavelength component of 600 nm and shorter. The second color conversion coloring material Y1 is a coloring matter that emits green light (wavelength range: 500 to 600 nm) through wavelength profile conversion, preferably a coloring material that emits green light by performing wavelength profile conversion on near ultraviolet light or blue to bluish green light. The second color conversion coloring material Y1 is decomposed by light including a wavelength component in the range of 500 nm and shorter. The components, including the color conversion coloring matter, of the laminated body according to this embodiment can be formed by the materials described in the first embodiment.

FIG. 2B shows an exposure step (color conversion layer forming step) in which exposure is performed through the transparent substrate 1 and the plural kinds of color filter layers 2. The coloring matter decomposition light 50 that is used for the exposure includes at least components capable of decomposing the red conversion coloring matter R1 and the green conversion coloring matter Y1, more specifically, both a wavelength component of 500 to 600 nm and a wavelength component of 500 nm and shorter. The coloring matter decomposition light 50 may be light including a wavelength component of 450 to 650 nm (may be white light). The auxiliary ultraviolet light 60 may be the same as used in the first embodiment.

In the exposure step, since the red color filter layer 2R does not transmit a wavelength component of 600 nm and shorter, neither the red conversion coloring matter R1 nor the green conversion coloring matter Y1 is decomposed in the portions of the coloring matter layer 3 that are located over the red color filter layer 2R. Therefore, a red conversion layer 4R containing the red conversion coloring matter R1 and the green conversion coloring matter Y1 is formed over the red color filter layer 2R. The red conversion layer 4R of this embodiment may perform wavelength profile conversion into red light by means of only the red conversion coloring matter R1. Alternatively, the red conversion layer 4R may wavelength-profile-convert green light emitted from the green conversion coloring matter Y1 into red light by means of the red conversion coloring matter R1.

The green color filter layer 2G transmits a wavelength component of 500 to 600 nm, but does not transmit a wavelength component of 500 nm and shorter. Therefore, in the portions of the coloring matter layer 3 that are located over the green color filter layer 2G, the red conversion coloring matter R1 is decomposed by the wavelength component of 500 to 600 nm but the green conversion coloring matter Y1 is not decomposed. The decomposition of the red conversion coloring matter R1 is very much accelerated by radicals that are generated by the optical radical generating agent that receives the auxiliary ultraviolet light 60. Therefore, a green conversion layer 4G containing the green conversion coloring matter Y1 is formed over the green color filter layer 2G. The green conversion layer 4G of this embodiment performs wavelength profile conversion into green light by means of only the green conversion coloring matter Y1.

The blue color filter layer 2B transmits a wavelength component of 400 to 500 nm. Therefore, in the portions of the coloring matter layer 3 that are located over the blue color filter layer 2B, both of the red conversion coloring matter R1 and the green conversion coloring matter Y1 are decomposed by the wavelength component of 400 to 500 nm. The decomposition of these color conversion coloring matter is very much accelerated by radicals that are generated by the optical radical generating agent that receives the auxiliary ultraviolet light 60. Therefore, in the example of FIGS. 2A-2C, a layer 4B that is formed over the blue color filter layer 2B does not contain any color conversion coloring matter.

FIG. 2C shows a color conversion filter that is obtained by the above exposure step. In the portions of the coloring matter layer 3 that are not covered with any color filter layer 2, the red conversion coloring matter R1 and the green conversion coloring matter Y1 are decomposed by a wavelength component of 400 to 500 nm. As a result, these portions of the coloring matter layer 3 become a planarized layer 5 containing no color conversion coloring matter. If blue or bluish green light is applied to this color conversion filter from the side of the color conversion layers 4, red light is produced by the red conversion layer 4R through wavelength profile conversion and emitted through the red color filter layer 2R. Green light is produced by the green conversion layer 4G through wavelength profile conversion and emitted through the green color filter layer 2G. Blue light is emitted through the blue color filter layer 2B.

As described above, the coloring matter decomposition light 50 should be applied perpendicularly to the coloring matter layer 3, that is, perpendicularly to the transparent substrate 1. This is because if the coloring matter decomposition light 50 were applied obliquely, not only the portions of the coloring matter layer 3 that are not covered with the color filter layers 2 but also the adjacent portions of the coloring matter layer 3 that are located over the color filter layers 2 would be exposed to the coloring matter decomposition light 50. The perpendicular application of the coloring matter decomposition light 50 is particularly important in the case where plural kinds of color conversion layers 4 are formed in a high-resolution pattern as in the case of this embodiment. This is because if the coloring matter decomposition light 50 were applied obliquely, a color conversion layer of a certain color might be formed in adjacent regions where a color conversion layer of another color should be formed.

Finally, a heating step is executed in the same manner as in the first embodiment, whereby the optical radical generating agent is vaporized and removed from the color conversion layers 4 and the planarized layer 5. A color conversion filter 30 in a final form is thus obtained.

The content of the color conversion coloring matter contained in the color conversion layers 4 of this embodiment, and the thickness of the color conversion layers 4 are the same as in the first embodiment. Also, in this embodiment, each color conversion layer may contain plural kinds of coloring matter.

In this embodiment, the coloring matter layer 3 may further contain blue conversion coloring matter B1 not designated in the drawings) that emits blue light by wavelength-profile-converting ultraviolet light or visible light. The blue conversion coloring matter B1 may be coloring matter that is not decomposed during performance of the method of the invention.

In the exposure step of FIG. 2B, the blue conversion coloring matter B1 is not decomposed in the portions of the coloring matter layer 3 that are covered with the color filter layers 2R, 2G, and 2B. Therefore, the blue conversion layer 4B is a layer containing the blue conversion coloring matter B1. And the color conversion layers 4R and 4G additionally contain the blue conversion coloring matter B1. In this case, the red conversion coloring matter R1 and/or the green conversion coloring matter Y1 may further wavelength-profile-convert blue light that is emitted by the blue conversion coloring matter B1. Where the blue conversion coloring matter B1 is used, the planarized layer 5 is a layer containing the blue conversion coloring matter B1.

Figure 3A:
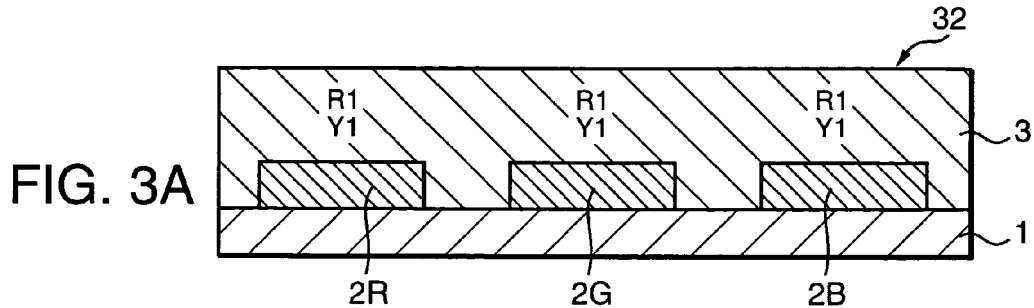
FIGS. 3A to 3D are schematic views illustrating a method of manufacturing a color conversion filter according to a modification of the second embodiment.
Figure 3B:
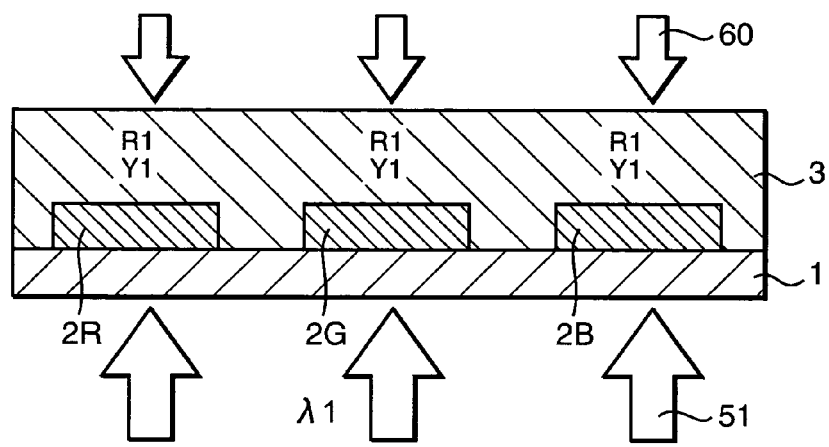

FIGS. 3A to 3D show a modification of the second embodiment. In the example of FIGS. 3A to 3D, a color conversion filter is formed by executing two exposure steps. A laminated body 32 shown in FIG. 3A is the same as shown in FIG. 2A. In a first exposure step shown in FIG. 3B, coloring matter decomposition light 51, including a wavelength component of 500 to 600 nm, is used. This wavelength component passes through the green color filter layer 2G and decomposes the red conversion coloring matter R1 in the coloring matter layer 3. The decomposition of the red conversion coloring matter R1 is very much accelerated by radicals that are generated by the optical radical generating agent that receives auxiliary ultraviolet light 60. On the other hand, since the red color filter layer 2R and the blue color filter layer 2B do not transmit this wavelength component, the red conversion coloring matter R1 is not decomposed in the portions of the coloring matter layer 3 that are located over the red color filter layer 2R and the blue color filter layer 2B.

Figure 3C:
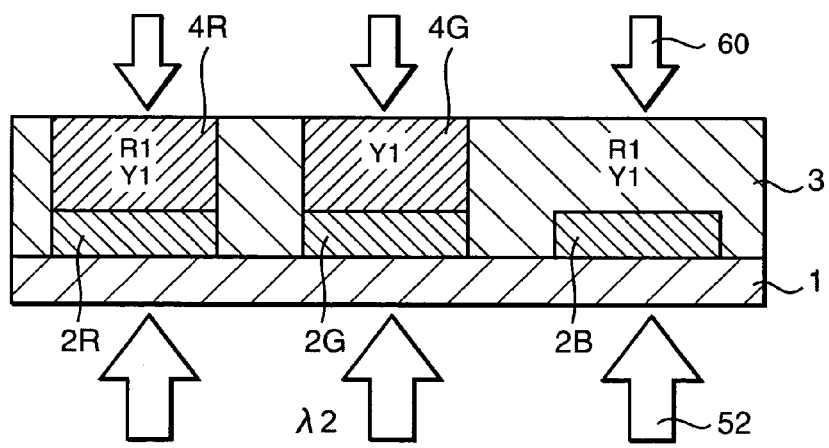

Then, in a second exposure step shown in FIG. 3C, coloring matter decomposition light 52 having a wavelength component of 400 to 500 nm is used. This wavelength component passes through the blue color filter layer 2B and decomposes the red conversion coloring matter R1 and the green conversion coloring matter Y1 in the coloring matter layer 3. The decomposition of these color conversion coloring materials is very much accelerated by radicals that are generated by the optical radical generating agent that receives the auxiliary ultraviolet light 60. On the other hand, since the red color filter layer 2R and the green color filter layer 2G do not transmit this wavelength component, the red conversion coloring matter R1 and the green conversion coloring matter Y1 are not decomposed in the portions of the coloring matter layer 3 that are located over the red color filter layer 2R and the green color filter layer 2G.

Figure 3D:
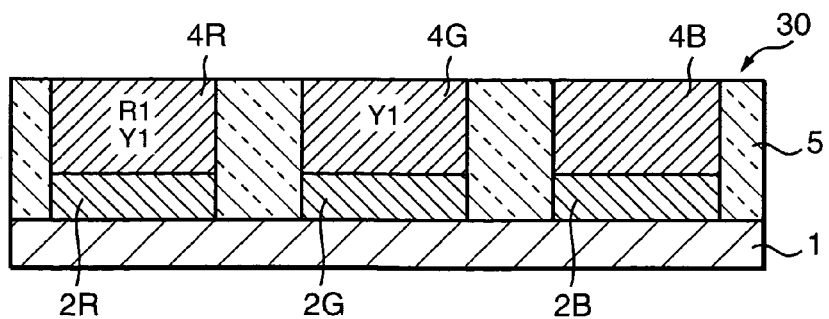

A color conversion filter 30 shown in FIG. 3D that is obtained by the above second exposure step is the same in structure as the color conversion filter 30 shown in FIG. 2C. In this modification, although the number of exposure steps is increased, a light source having a narrower emission wavelength range and higher intensity can be used in each exposure step. Therefore, the time taken for each exposure step can be shortened. In this modification, the order of the exposure steps is not fixed: an exposure step using a shorter wavelength component may be executed first.

Finally, a heating step is executed in the same manner as in the first embodiment, whereby the optical radical generating agent is vaporized and removed from the color conversion layers 4 and the planarized layer 5. A color conversion filter 30 in a final form is thus obtained.

Also in this modification, the coloring matter layer 3 may further contain blue conversion coloring matter B1 that emits blue light by wavelength-profile-converting ultraviolet light or visible light. In this case, the blue conversion layer 4B is a layer containing the blue conversion coloring matter B1.

As described above, a color conversion filter that provides the three colors (red, green, and blue) necessary for full-color display can be obtained by the method according to this embodiment. Therefore, a multicolor display device can be constructed by arranging a plurality of independently controllable light sources at positions corresponding to the respective color conversion layers. In this embodiment, the color conversion layers 4 can be formed at desired positions by a shorter-time process by self-alignment using, as a mask, the color filter layers 2 that are thin and can be formed at a high resolution. Further, since the matrix resin of the color conversion layers 4 and the planarized layer 5 remains the same as formed as part of the coloring matter layer 3, deformation or the like of the color conversion layers 4 can be prevented even if the width of the color conversion layers 4 is small relative to the film thickness.

Although this embodiment has been described for the case of forming color conversion layers 4 of the three colors red, green, and blue, it should be understood that other colors may be used. If necessary, two kinds or four kinds or more of, preferably two to six kinds of, color conversion layers 4 may be formed. Where six kinds of color conversion layers 4 are formed, it is desirable that, with assumptions that first to sixth color filter layers 2 transmit light in first to sixth wavelength ranges that are in descending order of wavelength and first to fifth color conversion coloring materials are in descending order of the wavelengths of light emitted through wavelength profile conversion, the first color conversion coloring matter be decomposed by light in the second wavelength range, and so forth (the fifth color conversion coloring matter be decomposed by light in the sixth wavelength range). Where the coloring matter layer 3 further contains a sixth color conversion coloring matter, it is desirable that the sixth color conversion coloring matter not be decomposed by light in the first to sixth wavelength ranges. The same is true of cases of forming two to five kinds of color conversion layers 4.

Where plural kinds of color conversion layers 4 are formed, what is called an area color display color conversion filter may be formed in which only a certain area is provided with a color conversion layer that is different from color conversion layers in the other areas. Further, a color conversion filter for a display device can be formed by arranging sets of rectangular or circular color conversion layers 4 of red, green, and blue in matrix form or arranging sets of parallel, striped color conversion layers 4 repetitively on the transparent substrate 1. In this case, a particular kind of color conversion layer may be formed in a larger number or a larger area than the other kinds of color conversion layers. Further, plural kinds of color conversion layers may be arranged so as to assume a certain pattern, sign, character, mark, or the like to display it. Still further, a single color that cannot be obtained by a single kind of color conversion layer 4 may be obtained by using two kinds of color conversion layers 4 that occupy minute separate areas having a proper area ratio.

A color conversion light-emitting device can be constructed by combining a light-emitting unit (i.e., light source) and a color conversion filter that is formed by the method according to the first or second embodiment of the invention. The light-emitting unit may be an arbitrary light source that emits light in a near ultraviolet to visible range, preferably blue to bluish green light. Examples of such a light source are an EL light-emitting device, a plasma light-emitting device, a cold-cathode tube, a discharge lamp (high-pressure or ultrahigh-pressure mercury vapor lamp), and light-emitting diodes (LEDs). The light-emitting unit is disposed on the side of the color conversion layers 4. Alternatively, the light-emitting unit may be laid directly on a color conversion filter that is formed by the method according to the invention. In this case, it is particularly advantageous that the top surface of the color conversion filter is flat.

Figure 4:
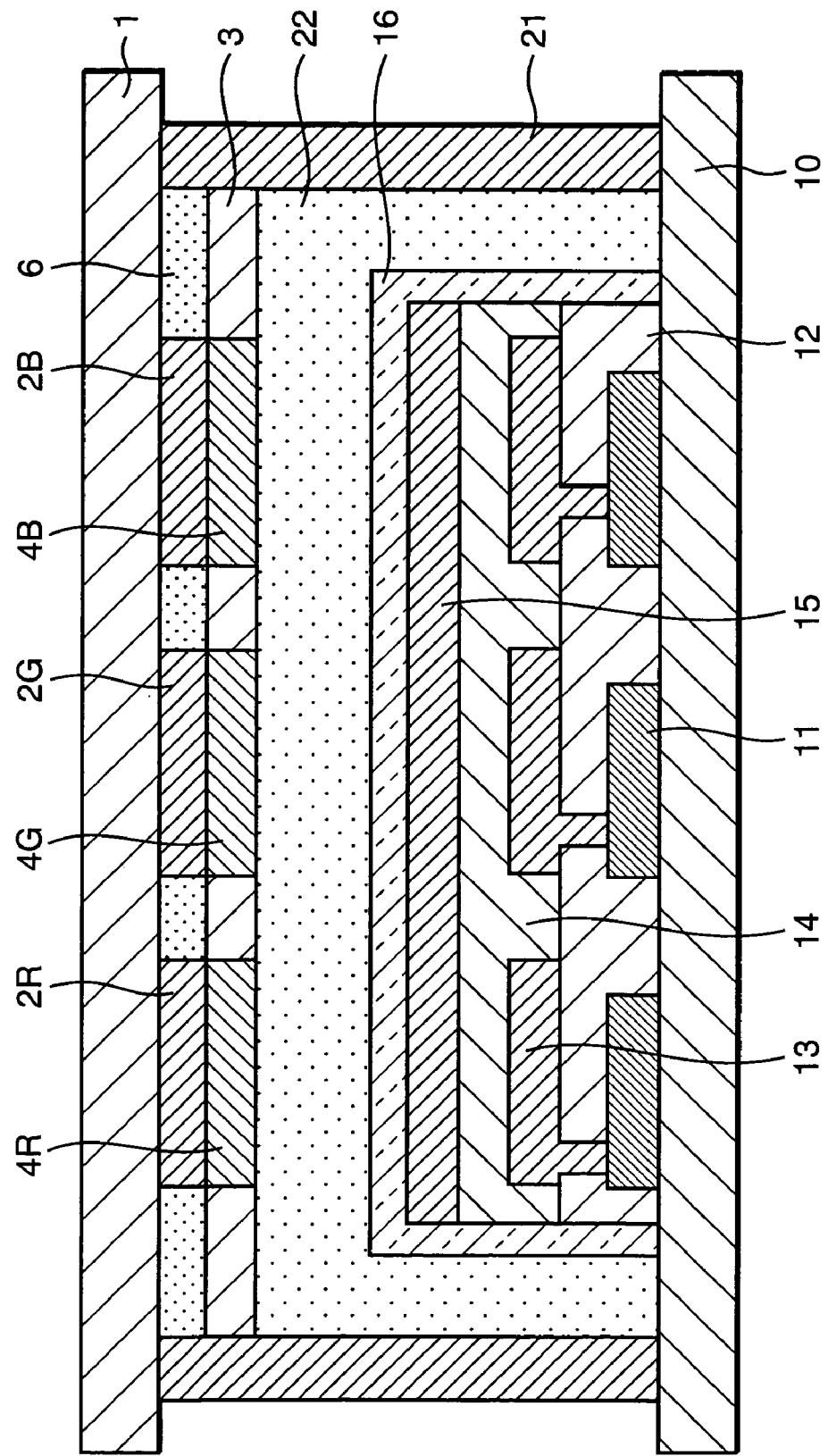
FIG. 4 is a schematic sectional view of an exemplary color conversion light-emitting device that is formed by using a color conversion filter that is manufactured by the method according to the invention.

FIG. 4 shows an exemplary color conversion light-emitting device according to the invention that is a top emission type organic EL display device constructed by bonding a color conversion filter. An organic EL device composed of a planarized film 12, bottom electrodes 13, an organic EL layer 14, a top electrode 15, and a passivation layer 16 is formed on a substrate 10 on which TFTs 11 as switching elements are formed in advance. The bottom electrodes 13 are separate reflective electrodes that are connected to the TFTs 11 one to one. The top electrode 15 is a transparent electrode that is uniform over its entire expanse. The layers constituting the organic EL device can be formed by using materials and methods that are known in the art.

On the other hand, blue, green, and red color filter layers 2B, 2G, and 2R and blue, green, and red conversion layers 4B, 4G, and 4R are formed on a transparent substrate 1. A black mask 6 for contrast improvement is formed between and around the color filter layers 2B, 2G, and 2R. Therefore, in the example of FIG. 4, a coloring matter layer 3, where all of the coloring matter remains undecomposed, coextends with the black mask 6 and functions as a planarized layer.

Then, the organic EL device and the color conversion filter are positioned with respect to and bonded to each other while a filler layer 22 is formed between them (the formation of the filler layer 22 is optional). Finally, the resulting structure is sealed with an outside sealing layer (adhesive) 21, whereby an organic EL display device is obtained. Although the display device of FIG. 4 is of an active matrix driving type, it goes without saying that a passive matrix driving type organic EL device may be used.

The above-mentioned organic EL layer 14 emits near ultraviolet to visible light, preferably blue to bluish green light. That light enters the color conversion layers 4B, 4G, and 4R, where the light is wavelength-profile-converted into visible light having desired colors. The organic EL layer 14 has a structure that includes at least an organic light-emitting layer and, if necessary, also includes selected ones of a hole injection layer, a hole transport layer, an electron transport layer, and an electron injection layer. More specifically, the following layered structures can be employed:

(1) Organic light-emitting layer
(2) Hole injection layer/organic light-emitting layer
(3) Organic light-emitting layer/electron injection layer
(4) Hole injection layer/organic light-emitting layer/electron injection layer
(5) Hole injection layer/hole transport layer/organic light-emitting layer/electron injection layer
(6) Hole injection layer/hole transport layer/organic light-emitting layer/electron transport layer/electron injection layer.

In the above structures, an anode is connected to the organic light-emitting layer or the hole injection layer and a cathode is connected to the organic light-emitting layer or the electron injection layer.

The individual layers are made of known materials. To attain blue to bluish green light emission, it is preferable that the organic light-emitting layer contain, for example, a fluorescent whitener of a benzothiazole type, a benzoimidazole type, a benzooxazole, or the like, a metal chelated oxonium compound, a styrylbenzene compound, an aromatic dimethylidyne compound, and other compounds. The hole injection layer may be made of a phthalocyanine compound such as copper phthalocyanine, a triphenylamine derivative such as m-MTDATA, or the like. The hole transport layer may be made of a biphenylamine derivative such as TPD or α-NPD, or the like. On the other hand, the electron transport layer may be made of an oxadiazole derivative such as PBD, a triazole derivative, a triazine derivative, or the like. The electron injection layer may be made of a quinolinol complex of aluminum, or the like. Alternatively, the electron injection layer may be made of an alkaline metal, an alkaline earth metal, an alloy including them, an alkaline metal fluoride, or the like.

Figure 5:
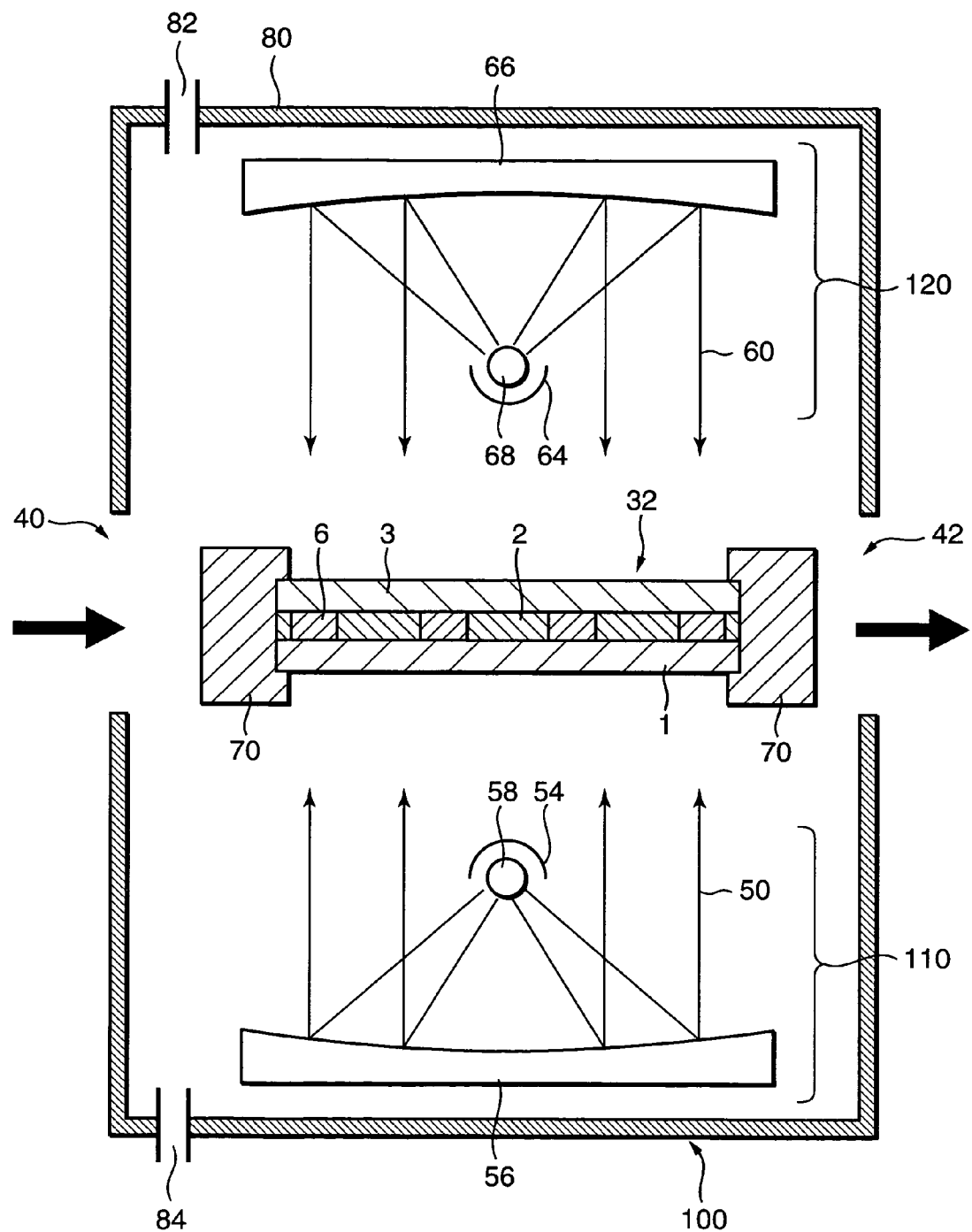
FIG. 5 is a schematic view showing an exemplary color conversion layer forming apparatus according to a third embodiment.

FIG. 5 shows a color conversion layer forming apparatus according to a third embodiment of the invention. The color conversion layer forming apparatus 100 of FIG. 5 is such that a substrate holding mechanism 70, a coloring matter decomposition light illuminating means 110, an auxiliary ultraviolet light illuminating means 120, etc. are provided in a container 80.

The substrate holding mechanism 70 is a mechanism for fixing, at an exposure position, a coloring matter layer laminated body 32 that is carried in through a delivery entrance 40 of the container 80. The laminated body 32 that has been exposed to light and in which color conversion layers 4 and a planarized layer 5 have thereby been formed, is carried out through a delivery exit 42 of the container 80. The laminated body 32 may be carried in by means of a separate carrying means such as a robot arm and held by a fixed substrate holding mechanism 70. Alternatively, the laminated body 32 may be carried in while held by a movable substrate holding mechanism 70 also having a carrying function. To enable exposure from both sides, that is, from the transparent substrate 1 side and the coloring matter layer 3 side, it is desirable that the substrate holding mechanism 70 be such as to hold peripheral portions of the laminated body 32 (transparent substrate 1). The delivery entrance 40 and the delivery exit 42 may have arbitrary structures. It goes without saying that an openable sealing means such as an automatic door (not shown) may be provided to isolate the atmosphere inside the container 80 from the environment air or to maintain the state of the atmosphere inside the container 80. Although the delivery entrance 40 and the delivery exit 42 are provided as a pair in the exemplary configuration of FIG. 5, a single delivery entrance/exit having the functions of both may be provided.

The coloring matter decomposition light illuminating means 110, which is disposed on the side of the transparent substrate 1 of the laminated body 32, may employ any of various mechanisms. For example, the coloring matter decomposition light illuminating means 110 shown in FIG. 5 employs a reflection optical system that consists of a decomposition light source 58, a light shield plate 54, and a reflector 56. The decomposition light source 58 may be either a point light source or a linear light source, and may be an arbitrary light source known in the art such as a halogen lamp, a metal halide lamp, an incandescent lamp, a discharge lamp, a mercury vapor lamp, or a laser, as long as it emits light in a wavelength range that is suitable for the coloring matter decomposition light 50.

The light shield plate 54 is provided to prevent direct light that includes components traveling not perpendicularly to the laminated body 32 (i.e., transparent substrate 1), from reaching to the substrate 1 from the decomposition light source 58. The light shield plate 54 is made of an arbitrary material that is opaque to the light emitted from the decomposition light source 58. The light shield plate 54 may have an arbitrary shape such as a hemisphere, a semicylinder, a cylinder, or a flat plane.

The reflector 56 is to reflect the light from the decomposition light source 58 and to thereby obtain a parallel light beam that is perpendicular to the laminated body 32 (i.e., transparent substrate 1). The reflector 56 is a concave mirror whose reflection surface is a spherical surface, a hyperboloidal surface, an aspherical surface, or the like, and can be made of an arbitrary material known in the art. In the apparatus according to the invention, it is preferable that the inner surface of the container 80 be coated with an anti-reflection coating to prevent non-perpendicular light from being generated through reflection of the coloring matter decomposition light 50 by the inner surface of the container 80.

Alternatively, a parallel light beam that is perpendicular to the laminated body 32 to be exposed to it, can be obtained by a direct incidence optical system having the decomposition light source 58 and a lens system. In this case, the lens system is disposed between the decomposition light source 58 and the transparent substrate 1. The lens system may be a single lens or a combination of lenses. The lenses used may be arbitrary ones known in the art, and may be spherical or aspherical, and have a normal or abnormal dispersion characteristic. In the reflection optical system shown in FIG. 5, a lens system maybe disposed between the decomposition light source 58 and the substrate 1 to improve the parallelism (i.e., the perpendicularity with respect to the substrate 1) of the coloring matter decomposition light 50.

The auxiliary ultraviolet light illuminating means 120, which is disposed on the side of the coloring matter layer 3 of the laminated body 32, may employ any of various mechanisms. For example, as shown in FIG. 5, the auxiliary ultraviolet light illuminating means 120 may employ a reflection optical system that consists of an ultraviolet light source 68, a light shield plate 64, and a reflector 66. The light shield plate 64 and the reflector 66 are similar to the light shield plate 54 and the reflector 56 of the coloring matter decomposition light illuminating means 110, respectively. The ultraviolet light source 68 may be either a point light source or a linear light source. It may be an arbitrary light source known in the art such as a mercury vapor lamp or a discharge lamp that is equipped with a proper ND filter, as long as it emits light in a wavelength range that is suitable for the auxiliary ultraviolet light 60.

In the apparatus according to the invention, the auxiliary ultraviolet light 60 need not necessarily be a parallel light beam that is incident on the laminated body 32 (i.e., transparent substrate 1) perpendicularly. However, a parallel light beam is desirable for the purpose of increasing the uniformity of the illumination light quantity. It goes without saying that a direct incidence optical system as described above may be employed.

It is desirable that the color conversion layer forming apparatus 100 according to the invention be further equipped with a heating means for heating the laminated body 32 (specifically, the coloring matter layer 3). For example, the heating means may be a resistance heater or an induction heater that is provided in the container 80, in which case the laminated body 32 is heated by convection heating. Alternatively, the heating means may be an infrared lamp, in which case the laminated body 32 is heated by radiation heating. As a further alternative, heating may be effected by forced circulation of the atmosphere inside the container 80. In this case, a forced circulation device may be provided in addition to the above-mentioned heating means for convection heating so as to be located inside the container 80 or connected to the container 80. Or a heating device may be incorporated in an atmosphere substituting means (described below).

It is desirable that the color conversion layer forming apparatus 100 according to the invention be further equipped with the atmosphere substituting means for lowering the oxygen concentration inside the container 80. The atmosphere substituting means may include an inert atmosphere (nitrogen gas or rare gas) storage container (not shown), a gas inlet 82, a gas outlet 84, and piping (not shown). Alternatively, an oxygen-removing device for removing oxygen from the environment air may be disposed between the gas inlet 82 and the environment air, in which case oxygen-removed environmental air (oxygen concentration: 5% or less) is introduced into the container 80. Although the gas inlet 82 and the gas outlet 84 are provided as a pair in the exemplary configuration of FIG. 5, a plurality of gas inlets 82 and a plurality of gas outlets 84 may be provided if necessary. Those gas inlets 82 and gas outlets 84 may be located at arbitrary positions.

The atmosphere substituting means may be such that a heating device is further disposed between the inert atmosphere storage container or the oxygen removing device and the gas inlet 82 and is given the function of the heating means for the laminated body 32 (specifically, the coloring matter layer 3). In this case, the heating device may be such as to perform any of resistance heating, induction heating, and radiation heating. Alternatively, the heating device may be such that a pipe that leads to the gas inlet 82 is provided with a mantle pipe and a heating medium such as vapor, hot water, or hot oil is caused to flow through the mantle pipe. Where the heating device is provided in the atmosphere substituting means, to heat the laminated body 32 (coloring matter layer 3) effectively, it is preferable to dispose the gas inlet 82 near the laminated body 32.

Figure 7A:
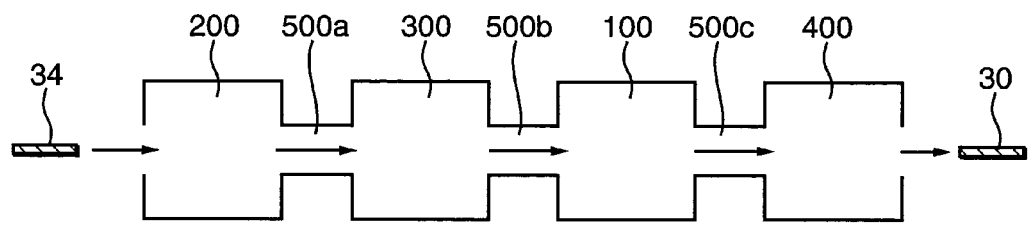
Figure 7B:
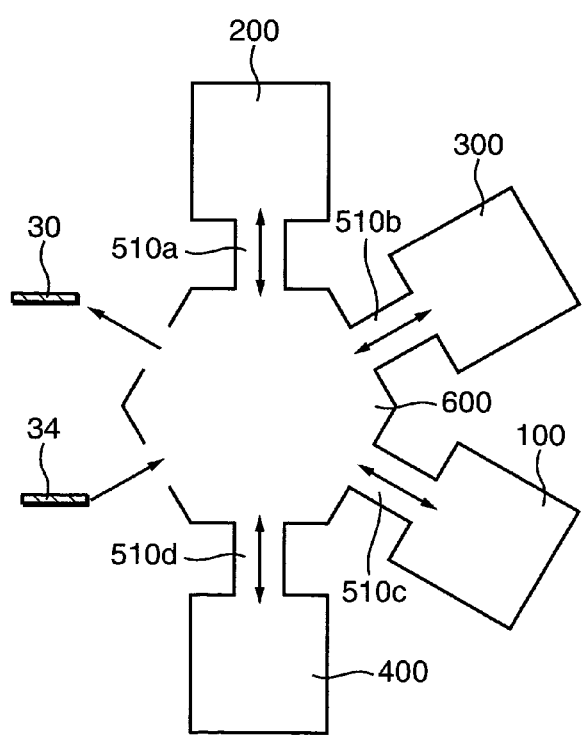

FIGS. 7A and 7B show apparatus for manufacturing a color conversion filter according to a fourth embodiment of the invention. The color conversion filter manufacturing apparatus of FIG. 7A and that of FIG. 7B are each include a coloring matter layer forming apparatus 200 for forming a coloring matter layer 3 on color filter layers that are formed on a transparent substrate (the transparent substrate on which the color filter layers are formed will be hereinafter referred to as "filter substrate 34"). Also included are a preliminary drying apparatus 300 for drying the coloring matter layer 3 preliminarily, a color conversion layer forming apparatus 100, and a heating and removing apparatus 400 for removing an optical radical generating agent by heating.

FIG. 7A shows a serial manufacturing apparatus in which the individual apparatus thereof are connected to each other by unidirectional communication passages 500*a*-500*c*. FIG. 7B shows a star-type manufacturing apparatus in which a central loading/locking room 600 is connected to the individual apparatus by bidirectional communication passages 510*a*-510*d*. The examples of FIGS. 7A and 7B employ the single color conversion layer forming apparatus 100. On the other hand, where the manufacturing apparatus is applied to the manufacturing method according to the above-described modification of the second embodiment of the invention, a plurality of coloring matter decomposition light sources 58 may be provided in a single color conversion layer forming apparatus 100. Or a plurality of color conversion layer forming apparatus 100 may be provided for the respective exposure steps.

The coloring matter layer forming apparatus 200 is an apparatus for forming a coloring matter layer 3 on color filter layers 2 and a transparent substrate 1 of a filter substrate 34 with a uniform thickness distribution. Such apparatus may be any of a number of known apparatus, for example, a spin coater, a knife coater, a roll coater, or a screen printing apparatus. Since a coating liquid containing fluorescent coloring materials, which is used for forming a coloring matter layer 3 according to the invention, is expensive, it is preferable to select a coloring matter layer forming apparatus 200 that is superior in liquid saving performance.

The preliminary drying apparatus 300 is an apparatus for removing a solvent component from a coated coloring matter layer 3 by heating. The preliminary drying apparatus 300 is equipped with a heating means that performs resistance heating, induction heating, or radiation heating or uses a heating medium. The heating by the preliminary drying apparatus 300 should be performed at such a temperature as to volatilize the solvent in a coloring matter layer coating liquid but not to volatilize the optical radical generating agent in the coating liquid. It is desirable that the substrate be heated to 120° C. or less, preferably 60 to 100° C.

Further, an air ventilation means such as a ventilator may be provided to lower the concentration of solvent vapor in the preliminary drying apparatus 300. This facilitates the removal of the solvent component. From an environmental viewpoint, it is desirable to provide a solvent collecting means (e.g., condenser) for collecting a solvent component that has been removed by volatilization.

The heating and removing apparatus 400 is an apparatus for removing, by heating, the optical radical generating agent remaining in the color conversion layers 4 and the planarized layer 5 (and the coloring matter layer 3 if it remains partially) The heating and removing apparatus 400 may have a heating means similar to the one used in the preliminary drying apparatus 300. However, in the heating and removing apparatus 400, the optical radical generating agent is removed by heating the substrate at 120° C. for 5 minutes, for example, or preferably at 180° C. for 3 minutes, at atmospheric pressure. The heating and removing apparatus 400 may be equipped with a pressure reducing means (e.g., vacuum pump) for facilitating the removal of the optical radical generating agent. Where the pressure reducing means is provided, it is desirable that a condenser be provided between the pressure reducing means and the main room to capture a vaporized optical radical generating agent. The pressure range may be 1 mmHg (0.13 kPa) to atmospheric pressure, preferably 5 mmHg (0.67 kPa) to 100 mmHg (13.3 kPa), even more preferably 10 mmHg (1.33 kPa) to 50 mmHg (6.67 kPa). Where the pressure is set at 10 mmHg (1.33 kPa), for example, time-shortening heating conditions in which heating is performed at 120° C. for 2 minutes, more preferably 180° C. for 1 minute.

In the serial manufacturing apparatus of FIG. 7A, a (semi-finished) product (filter substrate 34, laminated body 32, or color conversion filter 30) may be transported between the individual apparatus by conveyors, robot arms, or the like provided in the communication passages 500a-500c. The filter substrate 34 may be held by the substrate holding means 70 (refer to the description of the color conversion layer forming apparatus 100, above) and then the substrate may be transported between the individual apparatus while being held by the substrate holding means 70. Alternatively, the (semi-finished) product (filter substrate 34, laminated body 32, or color conversion filter 30) may be transported alone and mounted on a substrate holding means in each apparatus. Also in the star-type manufacturing apparatus of FIG. 7B, a (semi-finished) product may be transported in the above-described manner. In the star-type manufacturing apparatus, it is convenient to carry the (semi-finished) product into and out of each apparatus by a robot arm that is provided in the central loading/locking room 600.

EXAMPLE 1

After a blue filter material (Color Mosaic CB-7001 of Fujifilm Arch Co., Ltd.) was applied to a transparent glass substrate 1 by spin coating, patterning was performed by photolithography. As a result, a blue color filter layer 2B was formed in line patterns, wherein the lines were 0.1 mm in width, and 2 μm in thickness, separated by 0.33 mm and extended in the vertical direction.

Then, a solution of fluorescent light conversion coloring matter was prepared in which rhodamine 6G (0.3 part by weight), Basic Violet 11 (0.3 part by weight), and coumarin 6 (0.3 part by weight) were dissolved in a propylene glycol monoethyl acetate solvent (120 parts by weight). PMMA (poly(methyl methacrylate); 100 parts by weight) and di-tert-butyl peroxide (1 part by weight) were added to and dissolved in the prepared solution. As a result, a coating liquid was obtained. The coating liquid was applied by spin coating and dried by heating, whereby a 7-μm-thick coloring matter layer 3 was formed. Rhodamine 6G and Basic Violet 11 are red conversion coloring materials.

The decomposition rate of the coloring matter of the above-formed sample was measured when the sample was illuminated with coloring matter decomposition light or both coloring matter decomposition light and auxiliary ultraviolet light. A carbon arc lamp (white light source) disposed on the side of the transparent substrate 1, a light shield plate, and a reflector were used as a light source for coloring matter decomposition light. A mercury vapor lamp (with an ND filter) disposed on the side of the coloring matter layer 3, a light shield plate, and a reflector were used as a light source for auxiliary ultraviolet light. Coloring matter decomposition light and auxiliary ultraviolet light, each of which was a parallel light beam perpendicular to the transparent substrate 1, were obtained in the above-described manner. The intensity of the coloring matter decomposition light at the surface of the transparent substrate 1 was 1 W/cm$^2$, and the intensity of the auxiliary ultraviolet light at the surface of the coloring matter layer 3 was 30 mW/cm$^2$. Results are shown in Table 1. Table 1: How presence/absence of auxiliary ultraviolet light affects decomposition rate of color conversion coloring matter

| Illumination | Residual coloring matter ratio (%) | |
| --- | --- | --- |
| time (min) | Only coloring matter decomposition light | Coloring matter decomposition light plus auxiliary ultraviolet light |
| 0 | 100 | 100 |
| 5 | 90 | 30 |
| 10 | 77 | 10 |
| 30 | 55 | |
| 60 | 10 | |

It is seen from the results shown in Table 1 that the illumination with the auxiliary ultraviolet light accelerates the decomposition of the color conversion coloring matter very much. When the sample was illuminated with only the auxiliary ultraviolet light, the decomposition of the color conversion coloring matter progressed very slowly.

EXAMPLE 2

After a blue filter material (Color Mosaic CB-7001 of Fujifilm Arch Co., Ltd.) was applied to a transparent glass substrate 1 by spin coating, patterning was performed by photolithography. As a result a blue color filter layer 2B was formed in line patterns, the lines being 0.1 mm in width, separated by 0.33 mm, and 2 μm in thickness, and extended in the vertical direction.

After a green filter material (Color Mosaic CG-7001 of Fujifilm Arch Co., Ltd.) was applied, by spin coating, to the substrate 1 on which the blue color filter layer 2B was formed, patterning was performed by photolithography. As a result, a green color filter layer 2G was formed in line patterns, the lines being 0.1 mm in width, separated by 0.33 mm, and 2 μm in thickness, and extended in the vertical direction.

Then, after a red filter material (Color Mosaic CR-7001 of Fujifilm Arch Co., Ltd.) was applied by spin coating, patterning was performed by photolithography. As a result, a red color filter layer 2R was formed in line patterns, the lines being 0.1 mm in width, separated by 0.33 mm, and 2 μm in thickness, and extended in the vertical direction.

Then, a solution of fluorescent light conversion coloring matter was prepared in which coumarin 6 (0.3 part by weight), rhodamine 6G (0.3 part by weight), and Basic Violet 11 (0.3 part by weight) were dissolved in a propylene glycol monoethyl acetate solvent (120 parts by weight). PMMA (100 parts by weight) and di-tert-butylperoxide (1 part by weight) were added to and dissolved in the prepared solution, whereby a coating liquid was obtained. The coating liquid was applied by spin coating and dried by heating, whereby a 7-μm-thick coloring matter layer 3 was formed. Coumarin 6 is a green conversion coloring material, and rhodamine 6G and Basic Violet 11 are red conversion coloring materials.

A carbon arc lamp (white light source) disposed on the side of the transparent substrate 1, a light shield plate, and a reflector were used as a light source for coloring matter decomposition light. A mercury vapor lamp (with an ND filter) disposed on the side of the coloring matter layer 3, a light shield plate, and a reflector were used as a light source for auxiliary ultraviolet light. Coloring matter decomposition light and auxiliary ultraviolet light, each of which was a parallel light beam perpendicular to the transparent substrate 1, were obtained in the above-described manner. The intensity of the coloring matter decomposition light at the surface of the transparent substrate 1 was 1 W/cm$^2$, and the intensity of the auxiliary ultraviolet light at the surface of the coloring matter layer 3 was 30 mW/cm$^2$. Separate samples were formed in which color filter layers and a coloring matter layer were laminated on a glass substrate, and the photo decomposition behavior of the color conversion coloring matter of the samples was studied. A time until the absorption coefficient of the coloring matter became 1/10 of the initial value was used as an exposure time of this example. As a result of the exposure, a red conversion layer 4R containing coumarin 6, rhodamine 6G, and Basic Violet 11 was formed on the red color filter layer 2R and a green conversion layer 4G containing coumarin 6 was formed on the green color filter layer 2G. All the coloring matter was decomposed in the regions of the coloring matter layer 3 that were located on the blue color filter layer 2B or were not covered with any of the color filter layers 2R, 2G, and 2B. Finally, the resulting laminated body was heated at 160° C. and 1 mmHg (0.13 kPa) for 5 minutes, whereby residual di-tert-butyl peroxide was removed.

In the resulting color conversion filter, the color conversion layers 4R and 4G were formed at positions corresponding to the color filter layers 2R and 2G, respectively. No deformation or the like of the color conversion layers 4R and 4G was found.

EXAMPLE 3

After a black mask material (Color Mosaic CK-7000 of Fujifilm Arch Co., Ltd.) was applied to a transparent substrate 1 by spin coating, patterning was performed by photolithography, whereby a 1.5-μm-thick black mask 6 having a plurality of openings each measuring 0.33 mm (vertical)×0.09 mm (horizontal) were obtained. The interval between the openings were set at 0.03 mm in both of the vertical and horizontal directions.

Then, after a blue filter material (Color Mosaic CB-7001 of Fujifilm Arch Co., Ltd.) was applied by spin coating, patterning was performed by photolithography. As a result, a blue color filter layer 2B was formed in line patterns, the lines being 0.1 mm in width, separated by 0.33 mm, and 2 μm in thickness, and extended in the vertical direction.

After a green filter material (Color Mosaic CG-7001 of Fujifilm Arch Co., Ltd.) was applied, by spin coating, to the substrate 1 on which the blue color filter layer 2B was formed, patterning was performed by photolithography. As a result, a green color filter layer 2G was formed in line patterns, the lines being 0.1 mm in width, separated by 0.33 mm, and 2 μm in thickness, and extended in the vertical direction).

Then, after a green filter material (Color Mosaic CG-7001 of Fujifilm Arch Co., Ltd.) was applied, by spin coating, to the substrate 1 on which the blue color filter layer 2B was formed, patterning was performed by photolithography. As a result, a green color filter layer 2G was formed in line patterns, the lines being 0.1 mm in width, separated by 0.33, and 2 μm in thickness, and extended in the vertical direction).

Then, after a red filter material (Color Mosaic CR-7001 of Fujifilm Arch Co., Ltd.) was applied by spin coating, patterning was performed by photolithography. As a result, a red color filter layer 2R was formed in line patterns, the lines being 0.1 mm in width, separated by 0.33 mm, and 2 μm in thickness, and extended in the vertical direction.

Then, a fluorescent light conversion coloring matter solution was prepared in which coumarin 6 (0.3 part by weight), rhodamine 6G (0.3 part by weight), and Basic Violet 11 (0.3 part by weight) were dissolved in a propylene glycol monoethyl acetate solvent (120 parts by weight). PMMA (100 parts by weight) and di-tert-butylperoxide (1 part by weight) were added to and dissolved in the prepared solution, whereby a coating liquid was obtained. The coating liquid was applied by spin coating and dried by heating, whereby a 7-μm-thick coloring matter layer 3 was formed. Coumarin 6 is a green conversion coloring material, and rhodamine 6G and Basic Violet 11 are red conversion coloring material.

A carbon arc lamp (white light source) disposed on the side of the transparent substrate 1, a light shield plate, and a reflector were used as a light source for coloring matter decomposition light. A mercury vapor lamp (with an ND filter) disposed on the side of the coloring matter layer 3, a light shield plate, and a reflector were used as a light source for auxiliary ultraviolet light. Coloring matter decomposition light and auxiliary ultraviolet light, each of which was a parallel light beam perpendicular to the transparent substrate 1, were obtained in the above-described manner. The intensity of the coloring matter decomposition light at the surface of the transparent substrate 1 was 1 W/cm$^2$, and the intensity of the auxiliary ultraviolet light at the surface of the coloring matter layer 3 was 30 mW/cm$^2$. Separate samples were formed in which color filter layers and a coloring matter layer were laminated on a glass substrate, and the photodecomposition behavior of the color conversion coloring materials of the samples was studied. A time until the absorption coefficient of the coloring matter became 1/10 of the initial value was used as an exposure time of this example. As a result of the exposure, a red conversion layer 4R containing coumarin 6, rhodamine 6G, and Basic Violet 11 was formed on the red color filter layer 2R and a green conversion layer 4G containing coumarin 6 was formed on the green color filter layer 2G. All the coloring matter was decomposed in the blue conversion layer 4B that was located on the blue color filter layer 2B. Finally, the resulting laminated body was heated at 160° C. and 1 mmHg (0.13 kPa) for 5 minutes, whereby residual di-tert-butyl peroxide was removed.

In the resulting color conversion filter, pixels each measuring 0.36 mm×0.36 mm were formed in the openings of the black mask so as to be arranged in matrix form. Each pixel consisted of R, G, and B subpixels each measuring 0.33 mm (vertical)×0.09 mm (horizontal).

A 500-nm-thick Al layer and a 100-nm IZO layer were laminated, by sputtering with a mask, on a glass substrate 10 on which TFTs 11 and an insulative planarized film 12 having openings that corresponded to the source electrodes of the TFTs 11 were formed in advance. As a result first electrodes 13 were formed that corresponded to the TFTs 11 one to one. The first electrodes 13 measure 0.33 mm (vertical)×0.09 mm (horizontal) and were arranged in matrix form at intervals of 0.03 mm in both of the vertical and horizontal directions.

Then, the substrate in which the first electrodes 13 were formed was put in a resistance heating evaporation apparatus and an organic EL layer 14 was formed. The organic EL layer 14 had a 4-layer structure of hole injection layer/hole transport layer/organic EL light-emitting layer/electron injection layer. The pressure in a vacuum chamber was reduced to $1 \times 10^{-4}$ Pa and a 100-nm-thick copper phthalocyanine (CuPc, hole injection layer), a 20-nm-thick 4,4'-bis[N-(1-naphthyl)-N-phenylamino]biphenyl (α-NPD, hole transport layer), a 30-nm-thick 4,4'-bis(2,2'-diphenylvinyl)biphenyl (DPVBi, organic EL light-emitting layer), and a 20-nm-thick aluminum tris(8-quinolinolato) (Alq, electron injection layer) were laminated while the vacuum state was maintained, whereby an organic EL layer 80 was obtained. Further, a 10-nm-thick Mg/Ag layer (mass ratio: 10:1) and a 10-nm-thick IZO layer were laminated while the vacuum state was maintained, whereby a second electrode 15 was formed.

Finally, a passivation layer in the form of a 500-nm-thick $SiO_2$ layer was formed so as to cover the second electrode 15 and the structure underlying it, to complete formation of an organic EL light-emitting device.

Then, the color conversion filter was carried into a globe box in which each of the water concentration and the oxygen concentration was controlled to 1 ppm. An ultraviolet-curing adhesive (product name 30Y-437, produced by Three Bond Co., Ltd.) that was dispersed with 20-μm-diameter beads was applied, as an outside sealing layer 21, to an outside portion of the transparent substrate 1 of the color conversion filter by using a dispenser robot. The color conversion filter and the organic EL light-emitting device were bonded to each other while alignment was performed, to form a combined body. Then, the outside sealing layer 21 was cured by illuminating it with ultraviolet light at 100 mW/cm² for 30 seconds, whereby an organic EL display device product was obtained.

The application incorporates by reference the entire disclosures of the applicants' Japanese priority patent application Nos. 2003-348881, filed Oct. 7, 2003, and 2004-078935, filed Mar. 18, 2004.

The invention claimed is:

1. A method of manufacturing a color conversion filter, comprising the steps of:

forming a color filter layer on a transparent substrate;

forming a coloring matter layer containing color conversion coloring matter and an optical radical generating agent on the color filter layer;

exposing the coloring matter layer to coloring matter decomposition light that is applied through the transparent substrate and the color filter layer, and to auxiliary ultraviolet light that is applied from the side of the coloring matter layer, and thereby forming a color conversion layer at a position corresponding to the color filter layer; and vaporizing the optical radical generating agent by heating it, wherein the color conversion coloring matter is decomposed by light in a wavelength range that is outside of a wavelength range of light that the color filter layer transmits;

wherein the coloring matter decomposition light includes a wavelength component that decomposes the color conversion coloring matter; and wherein the color conversion layer emits, through wavelength profile conversion, light that the color filter layer transmits.

2. The method of manufacturing a color conversion filter according to claim 1, wherein the coloring matter decomposition light includes a wavelength component of 450 to 650 nm.

3. The method of manufacturing a color conversion filter according to claim 1, wherein the auxiliary ultraviolet light includes a wavelength component selected from among the G-line, the I-line, and the H-line.

4. The method of manufacturing a color conversion filter according to claim 1, wherein the optical radical generating agent is selected from radical polymerization initiators whose boiling temperature or sublimation temperature is lower than or equal to 200° C.

5. The method of manufacturing a color conversion filter according to claim 1, wherein the color conversion layer forming step is executed in an inert atmosphere.

6. The method of manufacturing a color conversion filter according to claim 1, wherein the color conversion layer forming step is executed in a state that a substrate temperature is higher than or equal to 50° C.

7. A method of manufacturing a color conversion filter, comprising the steps of:

forming first through nth kinds of color filter layers on a transparent substrate, n being an integer in the inclusive range of 2 to 6;

forming a coloring matter layer containing n−1 kinds of color conversion coloring matter and an optical radical generating agent on the n kinds of color filter layers;

applying coloring matter decomposition light to the coloring matter layer through the transparent substrate and the color filter layers and applying auxiliary ultraviolet light to the coloring matter layer from the side of the coloring matter layer, so as to expose the coloring matter layer to the coloring matter decomposition light and the auxiliary ultraviolet light, and thereby forming an mth kind of color conversion layer at a position corresponding to the mth kind of color filter layer, for each m, m equals 1 to n−1; and vaporizing the optical radical generating agent by heating it wherein the n kinds of color filter layers transmit light in different wavelength ranges;

wherein an mth kind of color conversion coloring matter is decomposed by light that the mth kind of color filter layer does not transmit; and wherein the mth kind of color conversion layer emits, through wavelength profile conversion, light that the mth kind of color filter layer transmits.

8. The method of manufacturing a color conversion filter according to claim 7, wherein the coloring matter decomposition light includes all wavelength components capable of decomposing the n−1 kinds of color conversion coloring matter.

9. The method of manufacturing a color conversion filter according to claim 7, wherein the (m+1) th kind of color filter layer transmits light in a shorter wavelength range than does the mth kind of color filter layer, and the mth kind of color conversion coloring matter is decomposed by light in a wavelength range that is shorter than a wavelength range of light that the mth kind of color filter layer transmits.

10. The method of manufacturing a color conversion filter according to claim 9, wherein the coloring matter decomposition light includes all wavelength components capable of decomposing the n−1 kinds of color conversion coloring matter.

11. The method of manufacturing a color conversion filter according to claim 9, wherein the exposure is performed at plural separate times, and wherein a wavelength component for decomposing the mth kind of color conversion coloring matter is included in one of a plurality of coloring matter decomposition light beams that are used for the plural separate times of exposure.

12. The method of manufacturing a color conversion filter according to claim 11, wherein the exposure is performed at n−1 separate times for each of the n−1 kinds of color conversion coloring matter, wherein the mth-time exposure is performed using light that includes a wavelength component capable of decomposing the mth kind of color conversion coloring matter.

13. The method of manufacturing a color conversion filter according to claim 7, wherein the coloring matter decomposition light includes a wavelength component of 450 to 650 nm.

14. The method of manufacturing a color conversion filter according to claim 7, wherein the auxiliary ultraviolet light includes a wavelength component of the G-line, the I-line, or the H-line.

15. The method of manufacturing a color conversion filter according to claim 7, wherein the optical radical generating agent is selected from radical polymerization initiators whose boiling temperature or sublimation temperature is lower than or equal to 200° C.

16. The method of manufacturing a color conversion filter according to claim 7, wherein said forming first through nth kinds of color filter layers is executed in an inert atmosphere.

17. The method of manufacturing a color conversion filter according to claim 7, wherein said forming first through nth kinds of color filter layers is executed in a state that a substrate temperature is higher than or equal to 50° C.

18. The method of manufacturing a color conversion filter according to claim 17, wherein the color conversion layer forming step is executed in a state that a temperature of the substrate is higher than or equal to 50° C.

19. The method of manufacturing a color conversion filter according to claim 18, wherein the exposure is performed during in plural separate times, and that a wavelength component for decomposing a kth kind of color conversion coloring matter is included in one of coloring matter decomposition light beams that are used for each of the separate times of exposure, for each k, k=1 to n−1.

20. The method of manufacturing a color conversion filter according to claim 7, wherein the exposure is performed at plural separate times, and wherein a wavelength component for decomposing the mth kind of color conversion coloring matter is included in one of a plurality of coloring matter decomposition light beams that are used for the plural separate times of exposure.

21. The method of manufacturing a color conversion filter according to claim 20, wherein the exposure is performed at n−1 separate times respectively for each of the n−1 kinds of color conversion coloring matter, wherein the mth-time exposure is performed using light that includes a wavelength component capable of decomposing the mth kind of color conversion coloring matter.

22. The method of manufacturing a color conversion filter according to claim 7, wherein the coloring matter layer further contains nth color conversion coloring matter, wherein an nth color conversion layer is formed by the exposure at a position corresponding to the nth color filter layer, and wherein the nth color conversion coloring matter emits, through wavelength profile conversion, light that the nth color filter layer transmits.

23. The method of manufacturing a color conversion filter according to claim 22, wherein the coloring matter decomposition light includes all wavelength components capable of decomposing the n−1 kinds of color conversion coloring matter.

24. The method of manufacturing a color conversion filter according to claim 22, wherein the (m+1) th kind of color filter layer transmits light in a range of shorter wavelength than wavelengths that the mth kind of color filter layer transmits, and the mth kind of color conversion coloring matter is decomposed by light in a range of wavelengths that are shorter than the wavelengths of light in a range of wavelengths that the mth kind of color filter layer transmits.

25. The method of manufacturing a color conversion filter according to claim 24, wherein the coloring matter decomposition light includes all wavelength components capable of decomposing the n−1 kinds of color conversion coloring matter.

26. The manufacturing method of a color conversion filter according to claim 22, where in the coloring matter decomposition light includes a wavelength component of 450 to 650 nm.

27. The method of manufacturing a color conversion filter according to claim 22, wherein the auxiliary ultraviolet light has a wavelength component the G-line, the I-line, or the H-line.

28. The method of manufacturing a color conversion filter according to claim 22, wherein the optical radical generating agent is selected from radical polymerization initiators whose boiling temperature or sublimation temperature is lower than or equal to 200° C.

29. The method of manufacturing a color conversion filter according to claim 22, where in the color conversion layer forming step is executed in an inert atmosphere.

30. The manufacturing method of a color conversion filter according to claim 22, wherein the exposure is performed during plural separate times, and a wavelength component for decomposing a kth kind of color conversion coloring matter is included in one of coloring matter decomposition light beams that are used for each of the separate times of exposure, for each k, k=1 to n−1.

31. The method of manufacturing a color conversion filter according to claim 30, wherein the exposure is performed during n−1 separate times, and the kth-time exposure is performed using light including a wavelength component capable of decomposing the kth kind of color conversion coloring matter.

* * * * *